United States Patent [19]

Koike et al.

[11] Patent Number: 5,557,507
[45] Date of Patent: Sep. 17, 1996

[54] APPARATUS HAVING SHIELD STRUCTURE

[75] Inventors: Noboru Koike; Hirokazu Seraku, both of Tokyo, Japan

[73] Assignee: Kabushiki Kaisha Toshiba, Kanagawa-ken, Japan

[21] Appl. No.: 265,027

[22] Filed: Jun. 24, 1994

[30] Foreign Application Priority Data

Jul. 28, 1993 [JP] Japan ..................... 5-186121

[51] Int. Cl.⁶ ..................................................... H05K 9/00
[52] U.S. Cl. ........................... 361/816; 361/796; 361/814; 361/818; 174/35 R; 439/607
[58] Field of Search ..................... 361/752, 796, 361/814, 816, 818; 248/27.1, 27.3; 405/89, 300, 90, 347; 174/50, 35 R, 35 MS; 257/659, 660; 439/607, 108, 109

[56] References Cited

U.S. PATENT DOCUMENTS

| | | | |
|---|---|---|---|
| 4,890,199 | 12/1989 | Beutler | 361/424 |
| 5,373,101 | 12/1994 | Barabolak | 174/35 R |
| 5,410,141 | 4/1995 | Koenck et al. | 235/472 |
| 5,420,759 | 5/1995 | Charlier et al. | 361/814 |

Primary Examiner—Leo P. Picard
Assistant Examiner—Y. Whang
Attorney, Agent, or Firm—Finnegan, Henderson, Farabow, Garrett & Dunner, L.L.P.

[57] ABSTRACT

An electronic apparatus includes first and second circuitry blocks mounted on opposite surfaces of a double-sided circuit board. A first shield case is attached to the circuit board so that the first shield case covers the first circuitry block. A second circuitry block is attached to the circuit board so that the second shield case covers the second circuitry block. A conductive component contacts the first and second shield cases and is engaged with the edge of the circuit board for enabling the circuit board to be electrically connected to the first and second shield cases.

31 Claims, 5 Drawing Sheets

APPARATUS HAVING SHIELD STRUCTURE

BACKGROUND OF THE INVENTION

1. Field of the Invention

The present invention generally relates to an electronic apparatus such as a portable telecommunication apparatus and, more particularly, to an electronic apparatus including circuitry blocks mounted on upper and lower surfaces of a circuit board and a shield structure shielding the circuitry blocks against electromagnetic wave radiation from one or more other apparatus and/or shielding one or more apparatus against electromagnetic wave radiation from the electronic apparatus.

2. Description of the Related Art

An electronic apparatus includes electronic components which often generate electromagnetic signals. The signals may radiate to and interfere with the operation of other apparatus. Further, the electronic apparatus may receive electromagnetic signals which are generated by the other apparatus causing interference with the operation of the electronic apparatus. To reduce such interference, electrically conducting material may be provided in the electronic apparatus between the electronic components of the electronic apparatus and the other apparatus. The electrically conducting material functions as a shield structure.

It is desirable to have an easily removable shield structure if a service person wishes to interchange the components in the electronic apparatus. Various structures have been developed to accomplish this purpose.

Figure 7:
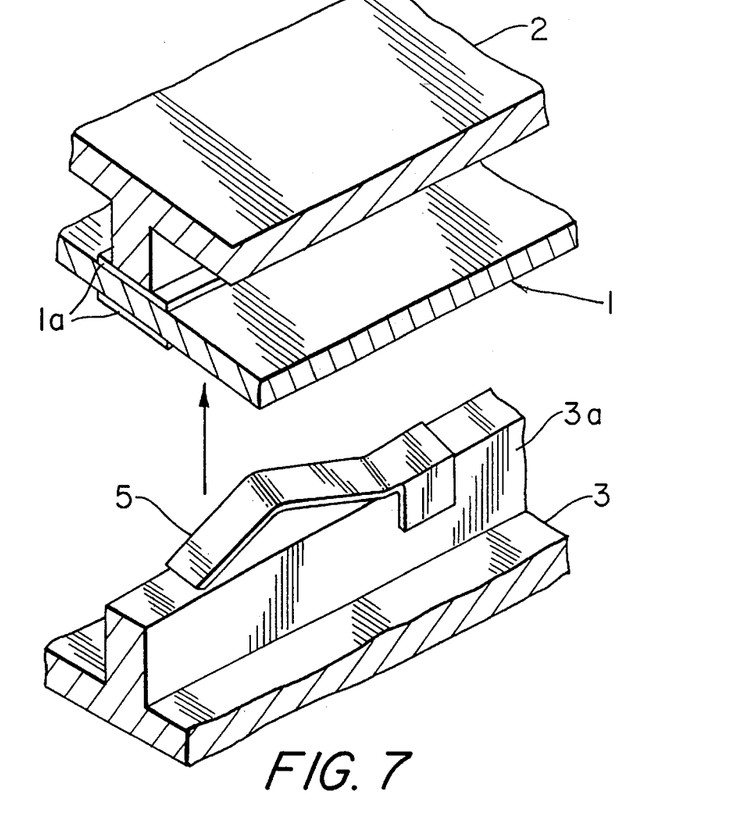
FIG. 7 is a partial perspective view illustrating a first conventional apparatus.
Figure 8:
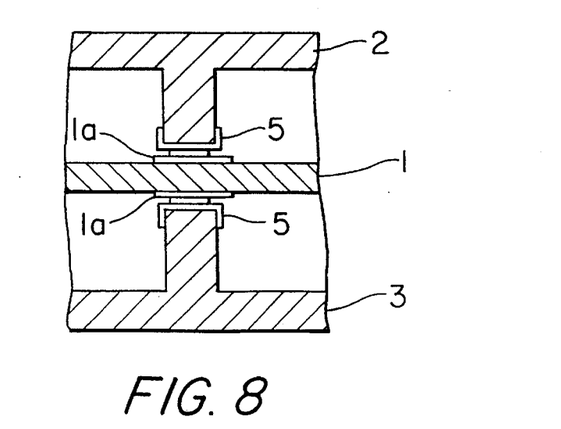
FIG. 8 is a partial cross-sectional side view illustrating the first conventional apparatus of FIG. 7.

One type of conventional shield structure is depicted in FIGS. 7 and 8. Referring to FIGS. 7 and 8, reference numeral 1 designates a double-sided circuit board having upper and lower surfaces. Electronic components (not shown) are mounted on each surface. Additionally, a ground 1a is printed on each surface.

Shield cases 2 and 3, each made of a conductive material, are designed to mate against circuit board 1. Shield case 3 has a protruding portion 3a fitted with a conductive spring 5. Shield case 3 is mounted against the lower surface of circuit board 1 by urging conductive spring 5 toward lower ground 1a using a fitting such as a screw (not shown). Conductive spring 5 contacts lower ground 1a as a result of the elasticity of conductive spring 5. In this manner, shield case 3 is electrically coupled to lower ground 1a through conductive spring 5. Shield case 3 then shields the electronic components mounted on the lower surface of circuit board 1 against electromagnetic radiation from other electronic apparatus.

Shield case 2, having essentially the same structure as shield case 3, is attached to the upper surface of circuit board 1 in the same manner as shield case 3 is attached to the lower surface of circuit board 1. Shield case 2 then shields the electronic components mounted on the upper surface of circuit board 1 against electromagnetic radiation from other electronic apparatus.

Since each spring 5 is required to attach to both shield case 2 and shield case 3, a spring 5 is required for each of shield cases 2 and 3. As a result, an increased number of springs 5 is required for the structure depicted in FIGS. 7 and 8. Further, it is troublesome to attach each spring 5 to its shield case 2 or 3.

Figure 9:
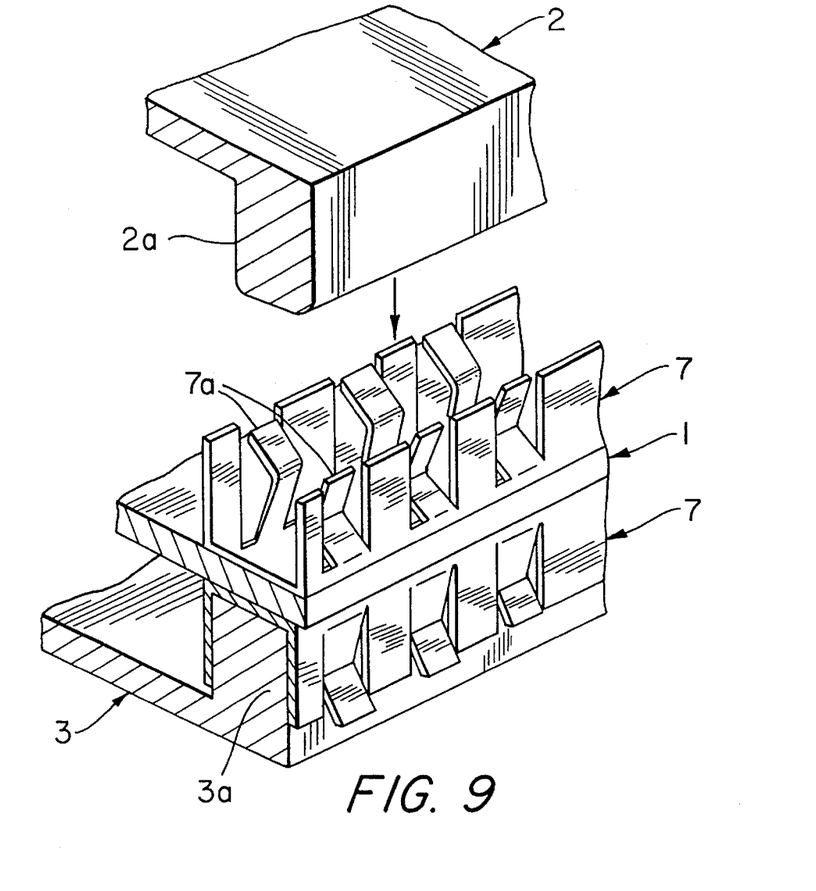
FIG. 9 is a partial perspective view illustrating a second conventional apparatus.
Figure 10:
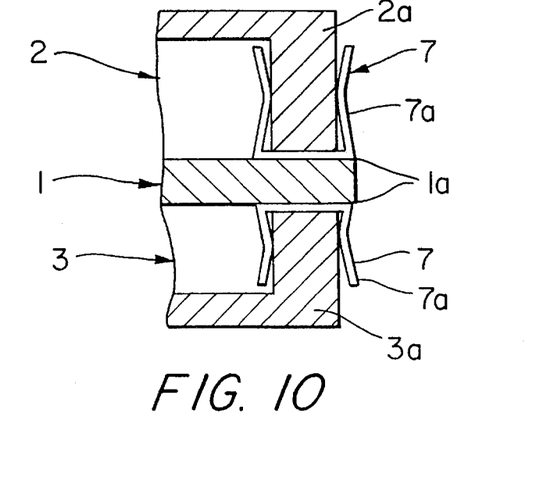
FIG. 10 is a partial cross-sectional side view illustrating the second conventional apparatus of FIG. 9.

FIGS. 9 and 10 show another conventional shield structure. For the structure of FIGS. 9 and 10, a U-shaped double-cantilever spring 7 is soldered in electrical contact to each of the grounds 1a of circuit board 1. Each spring 7 includes a pair of opposing clamping portions 7a. A protruding portion 2a from shield case 2 and a protruding portion 3a from shield case 3 are each inserted into corresponding pairs of clamping portions 7a. As a result, protruding portion 2a is clamped by clamping portions 7a of upper channel 7 and protruding portion 3a is clamped by clamping portions 7a of lower channel 7, due to the elasticity of the clamping portions. In this manner, each of shield cases 2 and 3 is attached to one of the surfaces of circuit board 1 and electrically coupled to one of the grounds 1a, as shown in FIG. 9. As a result, the electronic components mounted on each surface of circuit board 1 are shielded against electromagnetic radiation from other electronic apparatus by shield cases 2 and 3.

A disadvantage associated with the structure depicted in FIGS. 9 and 10 is that a U-shaped spring 7 must be attached to each surface of circuit board 1. As a result, an increased number of U-shaped springs 7 is required for the structure shown in FIGS. 9 and 10. Further, it is troublesome to attach each U-shaped spring 7 to each surface of circuit board 1.

SUMMARY OF THE INVENTION

Accordingly, the present invention has been made in view of the above circumstances and has as an object to provide an apparatus having first and second shield cases mounted on a circuit board, and a component for enhancing electrical connection of the first and second shield cases to the circuit board. In accordance with the present invention, the number of required conductive components is decreased as compared to conventional apparatus and thereby the number of attachments of the component to the circuit board is also decreased as compared to conventional apparatus.

To achieve these and other objects and advantages and in accordance with the purposes of the invention, there is provided:

An apparatus comprising a double-sided circuit board having a first surface and a second surface, a first ground being provided on a first edge portion of the first surface, a second ground being provided on a second edge portion of the second surface, a first circuitry block being mounted on the first surface, and a second circuitry block being mounted on the second surface, a conductive component having a groove portion engaged with the first edge portion and the second edge portion so that the conductive component contacts the first ground and the second ground, a first shield case mounted on the first surface so that the first shield case covers the first circuitry block and contacts the conductive component, and a second shield case mounted on the second surface so that the second shield case covers the second circuitry block and contacts the conductive component.

Additional objects and advantages of the invention will be set forth in part in the description which follows and in part will be apparent from the description, or may be learned by practice of the invention. The objects and advantages of the invention may be realized and attained by means of the instrumentalities and combinations particularly pointed out in the written description and claims hereof as well as the appended drawings.

It is to be understood that both the foregoing general description and the following detailed description are exemplary and explanatory and are intended to provide further explanation relating to the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DESCRIPTION OF THE PREFERRED EMBODIMENTS

Reference will now be made in detail to present preferred embodiments of the invention, examples of which are illustrated in the accompanying drawings.

Figure 1:
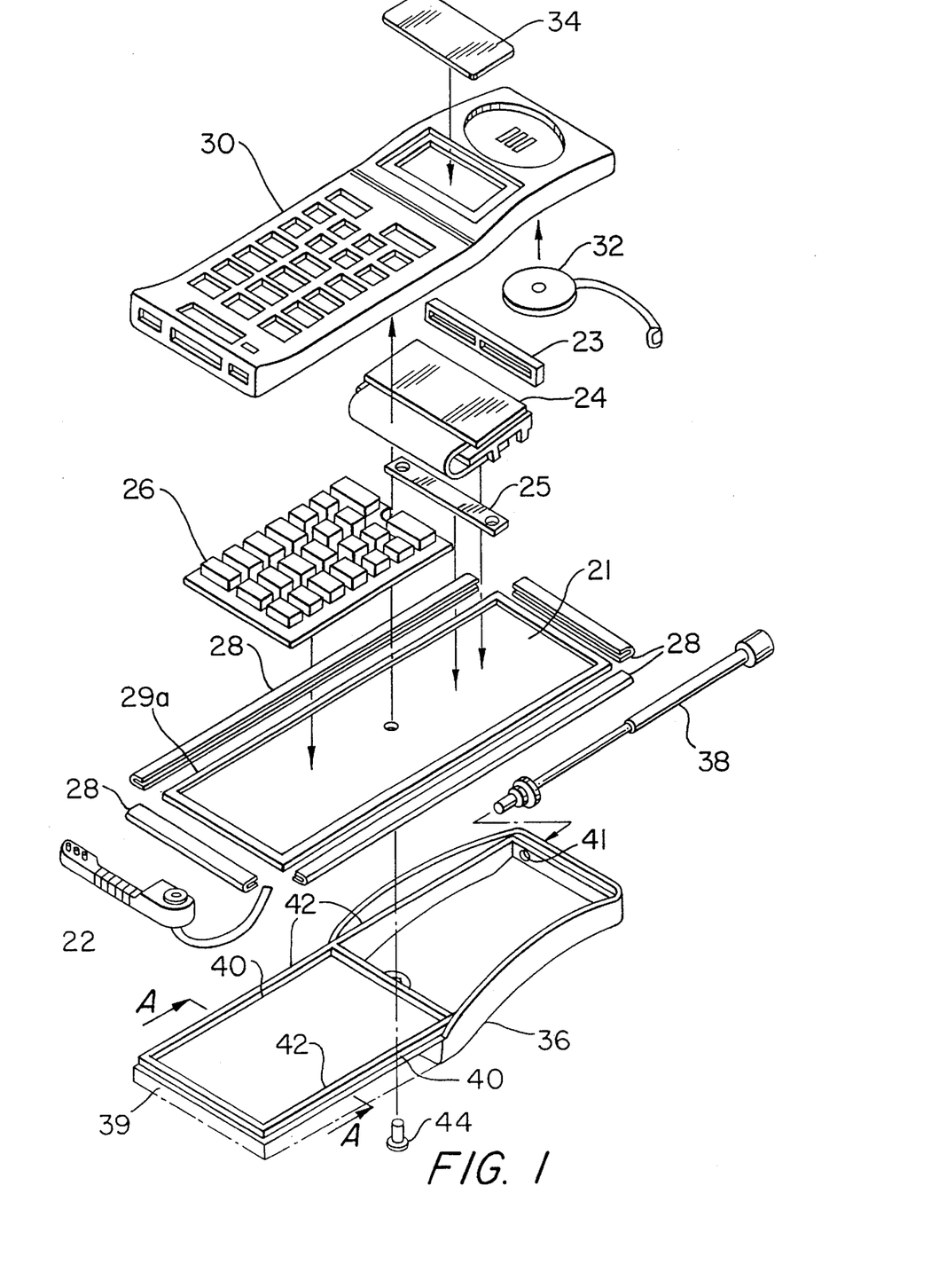
FIG. 1 is a perspective view illustrating a first embodiment of the present invention for use in connection with a portable radio telecommunication apparatus.

FIG. 1 shows a portable radio telecommunication apparatus (referred to hereinafter as a portable apparatus). In FIG. 1, reference numeral 21 designates a double-sided circuit board having upper and lower circuit surfaces, and reference numeral 22 designates a terminal holder. A light-emitting diode (LED) 23, a liquid crystal display (LCD) 24, a connector 25 connecting LCD 24 to circuit board 21, and a keypad 26 are mounted on the upper surface of circuit board 21. A first circuitry block comprises LED 23, LCD 24, connector 25, and keypad 26. A second circuitry block (not shown in FIG. 1) is mounted on the lower surface of circuit board 21.

The upper surface of circuit board 21 has an edge portion around its periphery. Likewise, the lower surface of circuit board 21 has an edge portion around its periphery. A first ground 29a is printed or otherwise provided on the edge portion of the upper surface. A second ground 29b (not shown in FIG. 1) is printed or otherwise provided on the edge portion of the lower surface. A conductive component 28, made of a conductive metallic material such as phosphor bronze, has groove which is fitted onto circuit board 21 so that the conductive component 28 clamps grounds 29a and 29b.

A first case 30 is made of a non-conductive plastic material such as polycarbonate. The inner surface of first case 30 is plated with a conductive material such as nickel. A receiver 32 and a panel 34 are attached to first case 30.

A second case 36 is also made of a non-conductive plastic material such a polycarbonate. The inner surface of second case 36 is plated with a conductive material such as nickel. Terminal holder 22 is attached to an inner portion of second case 36. An extendable antenna 38 is inserted into second case 36 through a hole 41 in the surface of second case 36. A battery pack 39 is attached to the back side of second case 36. Further, second case 36 has a protruding portion 40 with an upper surface 42.

Figures 2, 4, 5, 6:
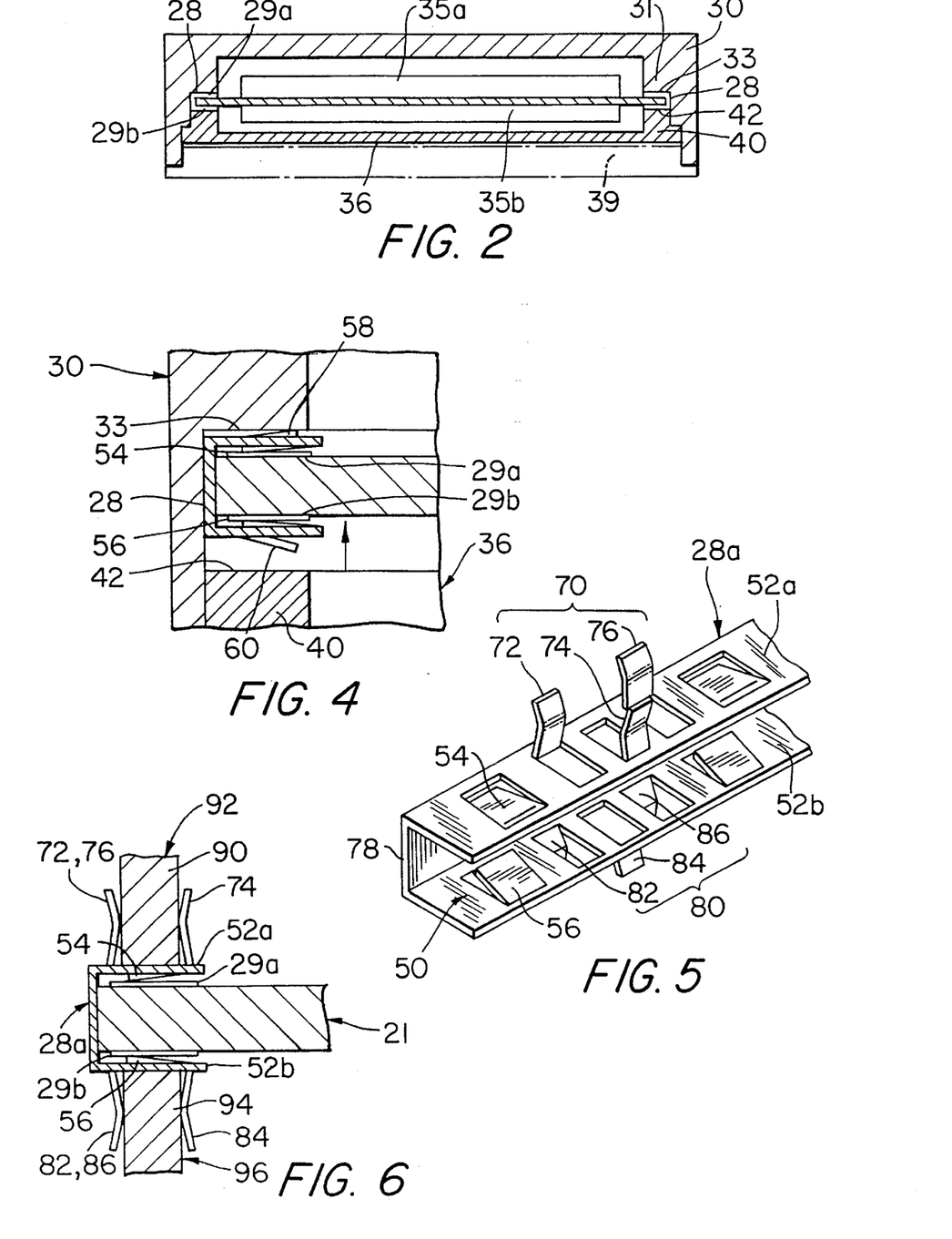
FIG. 2 is a cross-sectional view taken along line A—A of FIG. 1.
FIG. 4 is a partial cross-sectional side view illustrating aspects relating to the first embodiment of the present invention illustrated in FIG. 3.
FIG. 5 is a partial perspective view illustrating aspects relating to another embodiment of the present invention.
FIG. 6 is a partial cross-sectional side view illustrating aspects relating to another embodiment of the present invention.

Circuit board 21, first case 30, and second case 36 are secured together by a screw 44. More particularly, screw 44 passes through a hole in each of second case 36, circuit board 21, and keypad 26, and mates with a female screw component formed on the inner surface of first case 30. As shown in FIG. 2, which is a cross-sectional view taken along line A—A of FIG. 1, upper surface 42 of second case 36 is urged toward conductive component 28 by screw 44 (not shown in FIG. 2), and thereby contacts conductive component 28.

With further reference to FIG. 2, first case 30 includes a ledge portion 31 with a lower surface 33. Lower surface 33 of ledge portion 31 is also urged toward conductive component 28 by screw 44 (not shown in FIG. 2), and thereby contacts conductive component 28. In this manner, first case 30 covers and shields first circuitry block 35a (which includes LED 23, LCD 24, connector 25, and keypad 26, for example) mounted on the upper surface of circuit board 21. Second case 36 includes a protruding portion 40 with an upper surface 42. Upper surface 42 of protruding portion 40 is also urged toward conductive component 28 by screw 44, and thereby contacts conductive component 28. Therefore, second case 36 covers and shields second circuitry block 35b mounted on the lower surface of circuit board 21.

Figure 3:
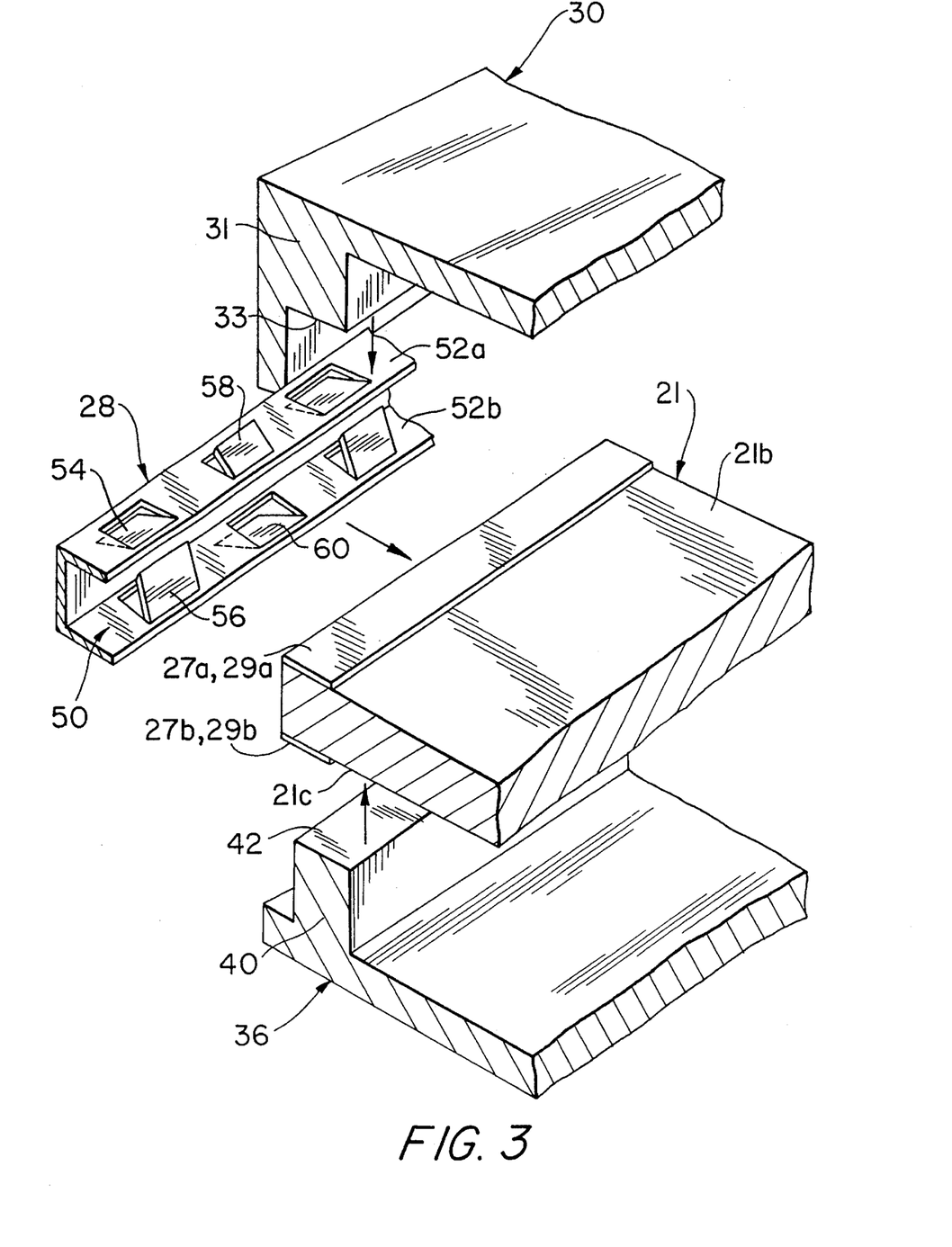
FIG. 3 is a partial perspective view illustrating aspects relating to the first embodiment of the present invention.

FIG. 3 shows a detailed connecting structure of circuit board 21, conductive component 28, first case 30, and second case 36 according to the first embodiment of the present invention. In FIG. 3, reference numeral 21b designates the upper surface of circuit board 21, and reference numeral 21c designates the lower surface of circuit board 21. Upper surface 21b has a first edge portion 27a around its periphery, where first ground 29a is provided. Likewise, lower surface 21c has a second edge portion 27b around its periphery, where second ground 29b is provided.

Conductive component 28 comprises a groove 50, and upper and lower walls 52a and 52b, respectively. The width of groove 50 is sufficient for circuit board 21 to be inserted therein. Walls 52a and 52b have first and second projecting portions 54 and 56 protruding from each wall 52a and 52b, respectively, into groove 50. Each of first and second projecting portions 54 and 56 has an elasticity which enables each of first and second projecting portions 54 and 56 to be temporarily moved toward walls 52a and 52b, respectively, when circuit board 21 is inserted into groove 50. Therefore, in the event that circuit board 21 is inserted into groove 50 of conductive component 28, first and second projecting portions 54 and 56 are moved toward walls 52a and 52b, respectively. As a result, first and second projecting portions 54 and 56 elastically clamp first and second grounds 29a and 29b due to the elasticity of first and second projecting portions 54 and 56. In this manner, conductive component 28 contacts first and second grounds 29a and 29b and is fitted to circuit board 21. In the event that conductive component 28 is removed from circuit board 21, each of first and second projecting portions 54 and 56 returns to the original position where it was prior to insertion of circuit board 21 into groove 50 of conductive component 28.

Walls 52a and 52b also have third and fourth projecting portions 58 and 60 protruding therefrom. Unlike first and second projecting portions 54 and 56, which protrude into groove 50 of conductive component 28, each of third and fourth projecting portions 54 and 56 protrudes in a direction away from groove 50. Moreover, each of third and fourth projecting portions 58 and 60 has an elasticity which enables each of third and fourth projecting portions 58 and 60 to be temporarily moved toward walls 52a and 52b, respectively, when each of first case 30 and second case 36 is urged toward circuit board 21.

Therefore, in the event that first case 30 is urged toward circuit board 21 by screw 44, as in FIG. 4, lower surface 33 of ledge portion 31 of first case 30 urges third projecting portion 58 toward wall 52a and groove 50. Thereby, lower surface 33 of ledge portion 31 of first case 30 sufficiently contacts third projecting portion 58 of conductive component 28.

Further, in the event that second case 36 is urged toward circuit board 21 by screw 44, upper surface 42 of protruding portion 40 of second case 36 urges fourth projecting portion 60 toward wall 52b and groove 50. Thereby, upper surface 42 of protruding portion 40 of second case 36 sufficiently contacts fourth projecting portion 60 of conductive component 28.

According to the first embodiment of the present invention, first case 30 and second case 36, which serve as shield cases, are sufficiently electrically coupled to grounds 29a and 29b through only one conductive component 28. Therefore, the number of conductive components for providing electrical connection between shield cases and corresponding grounds is reduced as compared to the number of conductive components required in conventional apparatus. Further, the number of attachments between the conductive component and the circuit board is reduced as compared to the number of attachments required for conventional apparatus.

Although first case 30 and second case 36 have heretofore been described as constituting the housing of the portable apparatus, first and second cases can alternatively be components of a conductive case which is independent or otherwise different from the housing. Also, although first case 30 and second case 36 have heretofore been described as comprising non-conductive material plated with conductive material, each of the first and second cases can be alternatively made of conductive material only.

In an alternative embodiment, shown in FIG. 5, third projecting portion 58 can be replaced by a third projecting portion 70, and fourth projecting portion 60 can be replaced by a fourth projecting portion 80, to arrive at a conductive component 28a. Third projecting portion 70 comprises a spring including a first V-shaped clamping portion 72, a second V-shaped clamping portion 74, and a third V-shaped clamping portion 76, with each of the clamping portions 72, 74, and 76 protruding above upper wall 52a of conductive component 28a in a direction away from groove 50.

First clamping portion 72 is made to protrude above upper wall 52a by bending the clamping portion in a counterclockwise direction as viewed by one looking at conductive component 28a from left end 78 of the conductive component 28a as depicted in FIG. 5. Second clamping portion 74 is made to protrude above upper wall 52a by bending the clamping portion in a clockwise direction as viewed by one looking at conductive component 28a from left end 78 of the conductive component. Third clamping portion 76 is made to protrude above upper wall 52a by bending the clamping portion in a counterclockwise direction as viewed by one looking at the conductive component 28a from left end 78 of the conductive component.

In the embodiment of FIG. 5, the clamping portions alternate so that every other one of the clamping portions protrudes from a different side of upper wall 52a of conductive component 28a. First, second, and third clamping portions 72, 74, and 76, respectively, have an elasticity which enables clamping portions 72, 74, and 76 to be temporarily moved relative to each other to separate clamping portions 72 and 76 from clamping portion 74 as shown in FIG. 6 when, for example, a wall 90 of a conductive first case 92 made of material the same as the first case 30 is inserted between first and third clamping portions 72 and 76 and second clamping portion 74. Therefore, when wall 90 of conductive first case 92 is inserted between first and third clamping portions 72 and 76 and second clamping portion 74, wall 90 is clamped by such clamping portions. As a result, wall 90 is electrically coupled to conductive component 28a.

Also, conductive first case 92 is electrically coupled to first ground 29a through conductive component 28a. More particularly, conductive first case 92 is electrically coupled to first ground 29a through projecting portion 54 of conductive component 28a. Although third projecting portion 70 is depicted in FIG. 5 as including three alternating clamping portions, in accordance with the present invention, third projecting portion 70 may include four, five, or more than five alternating clamping portions.

In the alternative embodiment of FIG. 5, fourth projecting portion 80 comprises a spring including a fourth V-shaped clamping portion 82, a fifth V-shaped clamping portion 84, and a sixth V-shaped clamping portion 86. Fourth clamping portion 82 is made to protrude below lower wall 52b by bending the clamping portion in a clockwise direction as viewed by one looking at conductive component 28a from left end 78 of the conductive component as depicted in FIG. 5. Fifth clamping portion 84 is made to protrude below lower wall 52b by bending the clamping portion in a counterclockwise direction as viewed by one looking at conductive component 28a from left end 78 of the conductive component. Sixth clamping portion 86 is made to protrude below lower wall 52b by bending the clamping portion in a clockwise direction as viewed by one looking at conductive component 28a from left end 78 of the conductive component.

In the embodiment of FIG. 5, the clamping portions alternate so that every other one of the clamping portions protrudes from a different side of lower wall 52b of conductive component 28a. Fourth, fifth, and sixth clamping portions 82, 84, and 86 have an elasticity which enables clamping portions 82, 84, and 86 to be temporarily moved relative to each other to separate clamping portions 82 and 86 from clamping portion 84 as shown in FIG. 6 when, for example, a wall 94 of a conductive second case 96 made of material the same as the second case 36 is inserted between fourth and sixth clamping portions 82 and 86 and fifth clamping portion 84. Therefore, when wall 94 of conductive second case 96 is inserted between fourth and sixth clamping portions 82 and 86 and fifth clamping portion 84, wall 94 is clamped by such clamping portions. As a result, wall 94 is electrically coupled to the conductive material of conductive component 28a.

Second conductive case 96 is electrically coupled to second ground 29b through conductive component 28a. More particularly, second conductive case 96 is electrically coupled to second ground 29b through projecting portion 56 of conductive component 28a. Although fourth projecting portion 80 is depicted in FIG. 5 as including three alternating clamping portions, in accordance with the present invention, fourth projecting portion 80 may include four, five, or more than five alternating clamping portions.

Although conductive components 28, 28a have heretofore been described as being made of conductive metallic material, the conductive components 28, 28a can alternatively be made of conductive elastomer material. In this case, the conductive components 28, 28a made of conductive elastomer can be constructed in a U-shape having a groove for receiving the circuit board without the first, second, third, and fourth projecting portions. Also, although conductive components 28, 28a have heretofore been described as being made of conductive material, the conductive components 28, 28a can alternatively be made of non-conductive plastic material, such as polycarbonate, with a conductive material, such as nickel, plated on the whole surface of the non-conductive material.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An apparatus comprising:

a double-sided circuit board having a first surface and a second surface, a first ground being provided on a first edge portion of the first surface, a second ground being provided on a second edge portion of the second surface, a first circuitry block being mounted on the first surface, and a second circuitry block being mounted on the second surface;

a conductive component having a groove portion engaged with the first edge portion and the second edge portion so that the conductive component contacts the first ground and the second ground;

a first shield case mounted on the first surface so that the first shield case covers the first circuitry block and contacts the conductive component; and a second shield case mounted on the second surface so that the second shield case covers the second circuitry block and contacts the conductive component.

2. The apparatus of claim 1, wherein the conductive component further comprises a first projecting portion projecting toward the first ground for contacting the first ground, and a second projecting portion projecting toward the second ground for contacting the second ground, and the first projecting portion and the second projecting portion project toward each other.

3. The apparatus of claim 2, wherein the conductive component further comprises first and second walls, the first projecting portion protrudes from the first wall toward the first ground and the second projecting portion protrudes from the second wall toward the second ground.

4. The apparatus of claim 1, wherein the conductive component further comprises a third projecting portion projecting toward the first shield case for contacting the first shield case, and a fourth projecting portion projecting toward the second shield case for contacting the second shield case.

5. The apparatus of claim 4, wherein the conductive component further comprises first and second walls, and the third projecting portion protrudes from the first wall toward the first shield case, and the fourth projecting portion protrudes from the second wall toward the second shield case.

6. The apparatus of claim 1, wherein the conductive component comprises third projecting portions projecting toward the first shield case for clamping a first protruding portion of the first shield case.

7. The apparatus of claim 6, wherein the conductive component comprises fourth projecting portions projecting toward the second shield case for clamping a second protruding portion of the second shield case.

8. The apparatus of claim 1, wherein the first shield case comprises a housing.

9. The apparatus of claim 1, wherein the second shield case comprises a housing.

10. The apparatus of claim 1, wherein the first and second shield cases enclose the apparatus.

11. An apparatus comprising:

a double-sided circuit board having a first surface and a second surface, a first ground being provided on a first edge portion of the first surface, a second ground being provided on a second edge portion of the second surface, a first circuitry block being mounted on the first surface, and a second circuitry block being mounted on the second surface;

a conductive component having a groove portion with a first elastic wall and a second elastic wall, the groove portion being engaged with the first edge portion and the second edge portion so that the first elastic wall contacts the first ground and the second elastic wall contacts the second ground;

a first shield case mounted on the first surface so that the first shield case covers the first circuitry block and contacts the first elastic wall; and a second shield case mounted on the second surface so that the second shield case covers the second circuitry block and contacts the second elastic wall.

12. The apparatus of claim 11, wherein the first elastic wall comprises a first projecting portion projecting toward the first ground for contacting the first ground, the second elastic wall comprises a second projecting portion projecting toward the second ground for contacting the second ground, and the first projecting portion and the second projecting portion project toward each other.

13. The apparatus of claim 11, wherein the first elastic wall comprises a third projecting portion projecting toward the first shield case for contacting the first shield case, and the second elastic wall comprises a fourth projecting portion projecting toward the second shield case for contacting the second shield case.

14. The apparatus of claim 11, wherein the first shield case comprises a housing.

15. The apparatus of claim 11, wherein the second shield case comprises a housing.

16. The apparatus of claim 11, wherein the first and second shield cases enclose the apparatus.

17. An apparatus comprising:

a circuit board having a first surface and a second surface, the first and second surfaces being located on opposite sides of the circuit board;

a first circuitry block disposed on the first surface of the circuit board;

a second circuitry block disposed on the second surface of the circuit board;

a first ground formed on an edge portion of the first surface of the circuit board;

a second ground formed on an edge portion of the second surface of the circuit board;

a conductive component including a first portion contacting the first ground and a second portion contacting the second ground;

a first shield case contacting the first portion of the conductive component and covering the first circuitry block; and a second shield case contacting the second portion of the conductive component and covering the second circuitry block.

18. The apparatus of claim 17, wherein the conductive component comprises a third portion connecting the first and second portions.

19. The apparatus of claim 18, wherein the third portion of the conductive contact extends along a side surface of the circuit board joining the first and second surfaces.

20. The apparatus of claim 17, wherein the conductive component comprises a U-shaped spring having a plurality of clamping portions projecting therefrom.

21. The apparatus of claim 20, wherein the plurality of clamping portions includes at least two clamping portions for clamping the first and second grounds therebetween.

22. The apparatus of claim 20, wherein the plurality of clamping portions includes at least two clamping portions for clamping the first shield case therebetween.

23. The apparatus of claim 20, wherein the plurality of clamping portions includes at least two clamping portions for clamping the second shield case therebetween.

24. The apparatus of claim 17, wherein the conductive component further comprises a first projecting portion projecting toward the first shield case for contacting the first shield case, and a second projecting portion projecting toward the second shield case for contacting the second shield case.

25. The apparatus of claim 24, wherein the conductive component further comprises first and second walls, the first projecting portion protrudes from the first wall toward the first shield case, and the second projecting portion protrudes from the second wall toward the second shield case.

26. A conductive component for electrically coupling first and second grounds formed on opposite first and second surfaces of a circuit board and first and second shield cases covering first and second circuitry blocks disposed on the opposite surfaces, the conductive component comprising:

means for contacting the first ground formed on the first surface of the circuit board;

means for contacting the second ground formed on the second surface of the circuit board;

means for contacting the first shield case covering the first circuitry block disposed on the first surface of the circuit board; and means for contacting the second shield case covering the second circuitry block disposed on the second surface of the circuit board.

27. The apparatus of claim 26, further comprising means for clamping the first shield case therebetween.

28. The apparatus of claim 26, further comprising means for clamping the second shield case therebetween.

29. The apparatus of claim 26, further comprising means for clamping the first ground and the second ground therebetween.

30. The apparatus of claim 26, wherein the conductive component further comprises a first projecting portion projecting toward the first shield case for contacting the first shield case, and a second projecting portion projecting toward the second shield case for contacting the second shield case.

31. The apparatus of claim 30, wherein the conductive component further comprises first and second walls, the first projecting portion protrudes from the first wall toward the first shield case, and the second projecting portion protrudes from the second wall toward the second shield case.

* * * * *